(12) United States Patent
Judge et al.

(10) Patent No.: US 8,315,408 B2
(45) Date of Patent: Nov. 20, 2012

(54) PREVENTION OF AUDIO POP IN A DIGITAL AUDIO DEVICE

(75) Inventors: Rupinder Judge, Binfield (GB); Tie Liu, Emmaus, PA (US); Robert Peruzzi, Allentown, PA (US); Richard Verney, Knaphill (GB)

(73) Assignee: Agere Systems LLC, Wilmington, DE (US)

( * ) Notice: Subject to any disclaimer, the term of this patent is extended or adjusted under 35 U.S.C. 154(b) by 203 days.

(21) Appl. No.: 12/499,936

(22) Filed: Jul. 9, 2009

(65) Prior Publication Data

US 2009/0275322 A1    Nov. 5, 2009

Related U.S. Application Data

(62) Division of application No. 10/354,040, filed on Jan. 30, 2003, now abandoned.

(51) Int. Cl.
*H04B 15/00* (2006.01)
*H04B 27/00* (2006.01)
*H03F 99/00* (2009.01)
*H02B 1/00* (2006.01)

(52) U.S. Cl. ...... 381/94.5; 381/94.1; 381/120; 381/123; 381/81; 381/83

(58) Field of Classification Search ............... 381/94.5, 381/93, 83, 120, 93.83, 94.1, 80, 81, 77, 381/123; 330/10, 207, 251 A, 254, 207 A, 330/251; 700/94
See application file for complete search history.

(56) References Cited

U.S. PATENT DOCUMENTS

| | | | |
|---|---|---|---|
| 4,127,743 A | 11/1978 | Ozawa et al. | 381/55 |
| 5,430,636 A | 7/1995 | Kachi | 363/58 |
| 5,550,868 A | 8/1996 | Boccuzzi | 375/330 |
| 5,642,074 A | 6/1997 | Ghaffaripour et al. | 330/51 |
| 5,796,851 A * | 8/1998 | Hewitt et al. | 381/94.5 |
| 6,157,726 A | 12/2000 | Carroll et al. | 381/94.5 |
| 7,020,293 B2 | 3/2006 | Shimotoyodome | 381/94.5 |
| 2003/0058040 A1 | 3/2003 | Miyagaki et al. | 330/10 |
| 2003/0067350 A1 | 4/2003 | Goutti et al. | 330/51 |

OTHER PUBLICATIONS

Non-Final Office Action; Mailed May 3, 2006 for corresponding U.S. Appl. No. 10/354,040, filed Jan. 30, 2003.
Final Office Action; Mailed Oct. 18, 2006 for corresponding U.S. Appl. No. 10/354,040, filed Jan. 30, 2003.

(Continued)

*Primary Examiner* — Devona Faulk
(74) *Attorney, Agent, or Firm* — Mendelsohn, Drucker & Associates, P.C.; Yuri Gruzdkov; Steve Mendelsohn

(57) ABSTRACT

An electronic audio device with a digital audio output channel in which an amplifier output voltage is gradually ramped up and down to avoid causing a popping sound when the device is turned on and off. This is accomplished without employing any additional hardware, by incrementally changing a digital input word applied to a digital audio source, such as a DSP, so as to gradually change the amplifier output voltage between a minimum, such as zero volts, and a DC working voltage. On powering up, the amplifier is only turned on after the digital word is applied, but while it still results in a minimum amplifier output, and on powering down the amplifier is turned off after it's output has been ramped down, but before removing the digital input word. Sources and output channels can also be switched over by powering down, and then powering up, following the same method.

20 Claims, 8 Drawing Sheets

OTHER PUBLICATIONS

Non-Final Office Action; Mailed Feb. 13, 2007 for corresponding U.S. Appl. No. 10/354,040, filed Jan. 30, 2003.
Non-Final Office Action; Mailed Nov. 27, 2007 for corresponding U.S. Appl. No. 10/354,040, filed Jan. 30, 2003.
Non-Final Office Action; Mailed Jun. 11, 2008 for corresponding U.S. Appl. No. 10/354,040, filed Jan. 30, 2003.
Non-Final Office Action; Mailed Dec. 26, 2008 for corresponding U.S. Appl. No. 10/354,040, filed Jan. 30, 2003.
Final Office Action; Mailed Apr. 24, 2009 for corresponding U.S. Appl. No. 10/354,040, filed Jan. 30, 2003.
Advisory Action; Mailed Jul. 7, 2009 for corresponding U.S. Appl. No. 10/354,040, filed Jan. 30, 2003.

* cited by examiner

PREVENTION OF AUDIO POP IN A DIGITAL AUDIO DEVICE

CROSS-REFERENCE TO RELATED APPLICATIONS

This application is a divisional of U.S. patent application Ser. No. 10/354,040, filed Jan. 30, 2003 now abandoned, and entitled "Prevention of Audio Pop in a Digital Audio Device," which is incorporated herein by reference in its entirety.

BACKGROUND OF THE INVENTION

1. Field of the Invention

This invention relates to preventing audio pop in an electronic audio device. More particularly, the invention relates to preventing audio pop in a digital audio circuit, such as in a cellular telephone.

2. Background of Related Art

An electronic device with an audio output, such as for example a cellular telephone, may include one or more audio channels. FIG. 5 shows a conventional audio output channel in a digital electronic audio device.

In particular, as shown in FIG. 5, a circuit such as that found in conventional cellular telephones includes an audio output channel driven by a digital audio source (e.g., a digital signal processor (DSP)) 100. The digital output signal corresponding to the relevant audio is output from the DSP 100 and converted to an analog signal by a digital-to-analog (D/A) converter 110 (e.g., a COder/DECoder (codec)), followed by an analog filter 120, and an amplifier 130. A speaker or headset load 150 is AC coupled to the output of the amplifier 130, represented in FIG. 5 by a capacitor 140.

However, when such a conventional audio output channel is powered on, a DC component of the output voltage of the amplifier 130 suddenly increases from, e.g., zero volts to it's DC working level of voltage. This sudden voltage change, when coupled through the AC coupling capacitor 140, causes the AC coupling capacitor to be charged rapidly, thus having a tendency to cause an annoying popping sound at the audio load 150 (e.g., speaker or headset), particularly if powered on at the peak of a loud waveform. Similarly, even when the audio circuit is turned off and the supply voltage is removed from the audio amplifier stage 130, the DC output voltage level suddenly decreases, rapidly discharging the AC coupling capacitor 140, thus causing a further popping sound to the listener through the audio load 150. In extreme cases, the cumulative effect of such loud popping sounds may even be harmful to the hearing of the listener.

Carroll et al. show in U.S. Pat. No. 6,157,726 a previous attempt to solve the above problem, reproduced in FIG. 6 of this application.

In particular, as shown in FIG. 6 herein, the output of the audio amplifier 130 is AC coupled to a parallel combination of two paths, each including a switch 570, 580. One path includes the audio load 150 and the switch 580, while the other path includes a dummy load 560 and the other switch 570. The audio load 150 may be a speaker, headset, or the like, whereas the dummy load 560 may be simply a resistor or other resistive device.

In the operation of the circuit of FIG. 6, the first analog switch 570 is closed and the second analog switch 580 is open when the supply voltage is initially applied to amplifier 530. The rising DC output voltage from amplifier 530 therefore charges the AC coupling capacitor 540, but the capacitor 540 is connected to the dummy load 560, and so no popping sound is heard at the load 550. Then, after the AC coupling capacitor 540 has been charged up, the first analog switch 570 is opened and the second analog switch 580 is closed, connecting the amplifier 530 to the load 550 via the AC coupling capacitor 540. Before the supply voltage to the amplifier 530 is turned off, the second analog switch 580 is re-opened and first analog switch 570 is re-closed, so that the AC coupling capacitor is discharged through the dummy load 560, thus avoiding a popping sound heard by the listener at the actual audio load 550.

However, the circuit of FIG. 6 is somewhat disadvantageous in that it requires not only additional components in the audio path itself (e.g. two switches 570, 580 and a dummy load 560), but also some form of control circuitry, including circuitry needed to sense when the audio output channel is being turned on or off.

There is a need for a technique and apparatus to eliminate a popping sound without the introduction of additional and/or complex circuitry.

SUMMARY OF THE INVENTION

A method and apparatus for applying power to a digital audio channel in accordance with the principles of the present invention comprises applying a digital input signal to the digital audio channel. The digital input signal initially has a value such that a DC output voltage of the digital audio channel is at a minimum. The value of the digital input signal is gradually increased independent of an input audio signal such that the DC output voltage increases gradually until the DC output voltage is equal to a working voltage. Then the input audio signal is passed through the digital audio channel.

A method and apparatus for removing power from a digital audio channel in accordance with another aspect of the present invention comprises halting an input audio signal from passing through the digital audio channel. A value of a digital input signal is gradually decreased from a point of the halted input audio signal such that a DC output voltage of an amplifier of the digital audio channel decreases gradually until the DC output voltage is at a minimum.

BRIEF DESCRIPTION OF THE DRAWINGS

Features and advantages of the present invention will become apparent to those skilled in the art from the following description with reference to the drawings, in which.

DETAILED DESCRIPTION OF ILLUSTRATIVE EMBODIMENTS

Figure 1A:
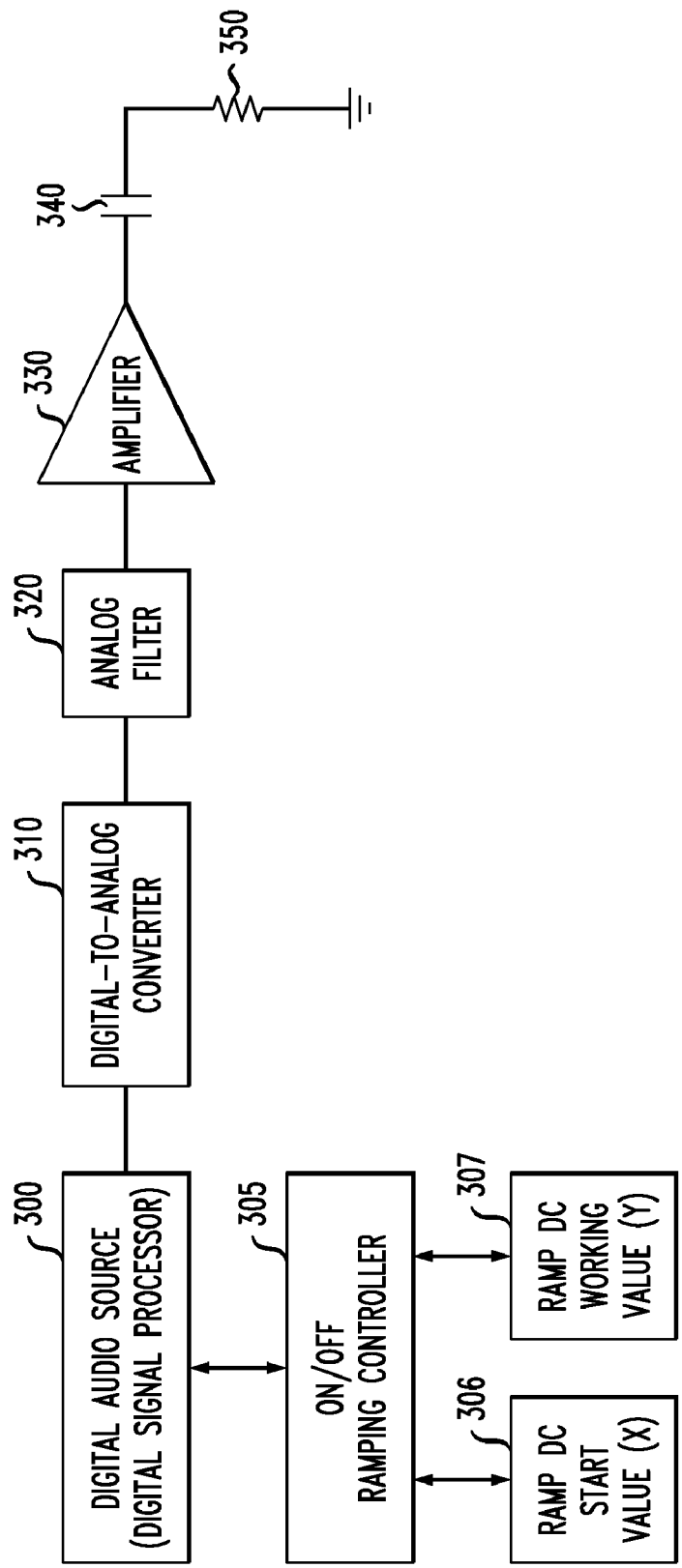
FIG. 1A is a block diagram of an embodiment having an audio output channel for digital audio.

A block diagram of a digital audio output channel for an electronic audio device, such as, for example, a cellular telephone, is shown in FIG. 1A.

In particular, as shown in FIG. 1A, a digital audio output channel is driven by a digital audio source 300, which may be, for example, a Digital Signal Processor (DSP). The digital audio output channel also includes a digital-to-analog (D/A) converter 310, an analog filter 320, and an amplifier stage 330. An audio output load 350 is AC coupled via an AC coupling capacitor 340. The audio output load 350 may be any appropriate audio output transducer, e.g., a loudspeaker or a headset. AC coupling capacitor 340 serves in the usual fashion to block the DC component of the dynamic analog output signal from the audio amplifier 330.

Importantly, the audio output circuit in accordance with the principles of the present invention further includes an on/off ramping controller to control the output signal from the audio amplifier 330 to any desired DC level. In the disclosed embodiments, the on/off ramping controller 305 ramps either linearly or non-linearly between a DC start value (X) stored in a first register or similar memory location 306, and a desired DC working value (Y) stored in a second register or similar memory location 307.

The DC start value X and/or the DC working value Y may be empirically determined based on desirous results. Alternatively, the DC start value X and/or the DC working value Y may be pre-set to values such as X=0 volts and Y=0.5 times the maximum DC level output from the audio amplifier 330. Other determinations of the DC start value X and DC working value Y are possible and within the scope of the present invention. For instance, a moving average of the DC level output from the audio amplifier 330 may be measured over a period of time and used as a basis for the determination of the DC working value Y. Also, the DC working value Y may be measured during a quiet period.

It will be appreciated by one skilled in the art that the audio output channel configuration shown in FIG. 1 is but one exemplary arrangement, and that many other circuit variations are possible and encompassed by this disclosure.

In conventional digital audio circuits, the AC coupling capacitor stores a substantial electrical charge in normal operation, giving rise to the possibility of a popping sound to the listener.

Thus, in accordance with a preferred embodiment of the present invention, additional circuitry such as is required by Carroll et al. in U.S. Pat. No. 6,157,726 is eliminated by employing the on/off ramping controller 305, including references to ramp from a DC start value X to a DC working value Y, before allowing full audio operations of the digital audio circuit.

The length of the ramp in time may be adjustable, and is preferably sufficiently short to have little if any effective delay as perceived by the listener, yet allows sufficient time for a smooth transition of the DC output of the audio amplifier 330 to a suitable working voltage level.

The on/off ramping controller 305 may be a separate element, or preferably integrated within a processor already resident in the relevant circuit (e.g., a digital signal processor). The on/off ramping controller 305 gradually ramps up as the digital audio path is turned on, and gradually ramps down the output voltage of the audio amplifier stage 330, preferably under the control of software.

Figure 2:
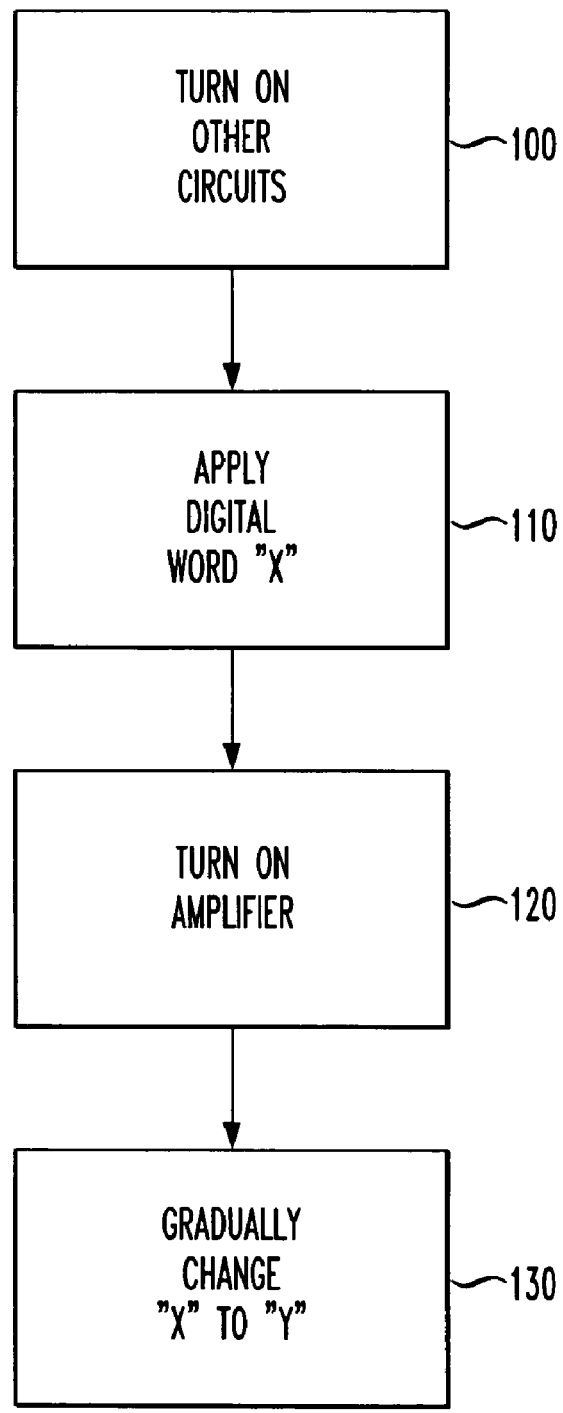
FIG. 2 is a flow chart of a method according to the present invention.

FIG. 2 shows a flowchart of an exemplary method of turning an electronic audio device on, according to a preferred embodiment of the present invention.

In particular, as shown in step 100 of FIG. 2, all elements in the digital audio channel other than the amplifier stage 330 are fully powered up, i.e. the digital audio source 300, the D-A converter 310 and the analog filter 320 are each powered up, leaving the amplifier stage 330 in an off state. Then, in step 110, a digital word "X" is applied to the digital audio source 300, where the digital word "X" corresponds to an output voltage of zero volts from the amplifier stage 330. Next, in step 120, the amplifier stage 330 is powered up. At that point in time, the output voltage of the amplifier stage 330 will be zero volts. Then, in step 130, the digital word applied to the digital audio source 300 is changed gradually from "X" to "Y", where the digital word "Y" corresponds to the normal DC working voltage being present at the output of the amplifier stage 330. This gradual change in the value of the digital word generates a voltage ramp at the output of the amplifier stage 330. The slope of this voltage ramp is adjusted to take into account the total combined group delay of any internal filters and of the AC coupling capacitor 340 and the load 350. The digital audio channel is then powered up and is ready for use.

Figure 3:
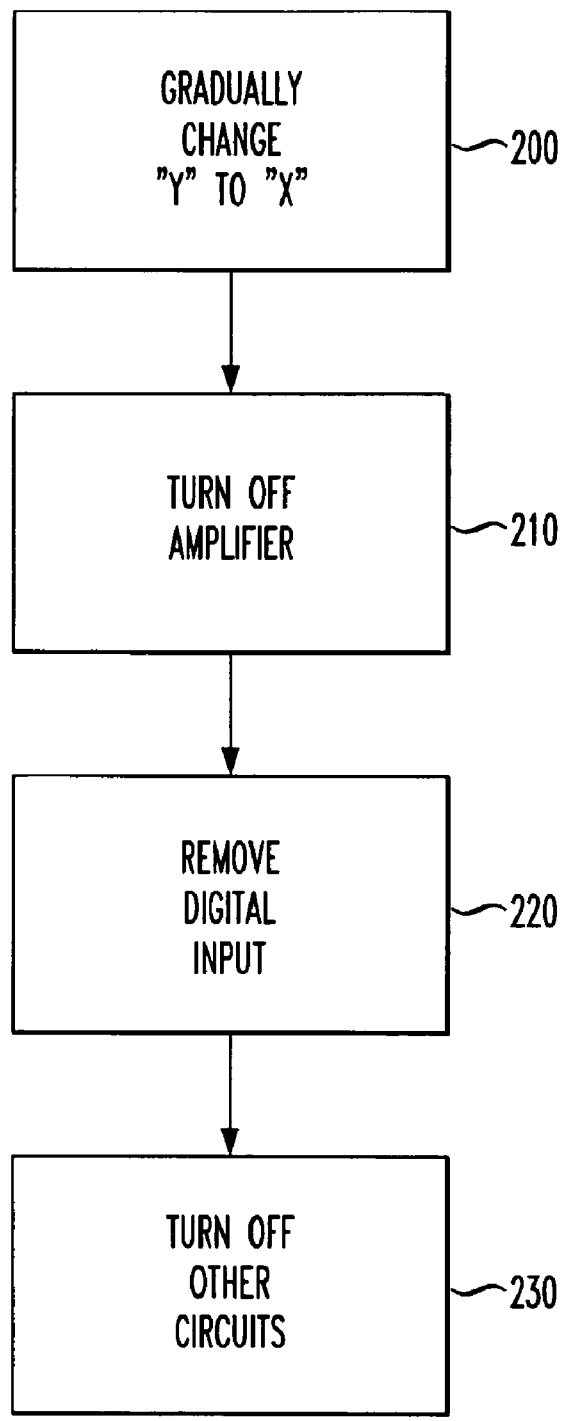
FIG. 3 is a further flow chart of a method according to the present invention.

FIG. 3 is a flowchart of an exemplary method of turning the electronic audio device off according to a preferred embodiment of the invention.

In particular, as shown in step 200 of FIG. 3, the digital word is gradually changed from it's last state to "X". Then, in step 210, the amplifier stage 330 is powered off.

In step 220, the digital input word "X" is finally removed. Of course, the digital value X may be left in place at all times when the amplifier 330 is powered on and unused. Then, when it is powered down, the output signal will fall only between the X level and 0 or ground (presuming that the X value is non-zero).

In step 230, the digital audio source 300, the D-A converter 310 and the analog filter 320 are each powered down, either simultaneously or in sequence. At this point, the digital audio channel is powered down.

The shape of the voltage ramp employed in the above methods is not necessarily linear, but may be any shape, for example exponential or other non-straight-line method.

The digital word corresponding to the DC start value "X" need not necessarily correspond to an output voltage of zero volts, but rather may correspond to a non-active level of the audio signal at the output of the audio amplifier 330.

Figure 4:
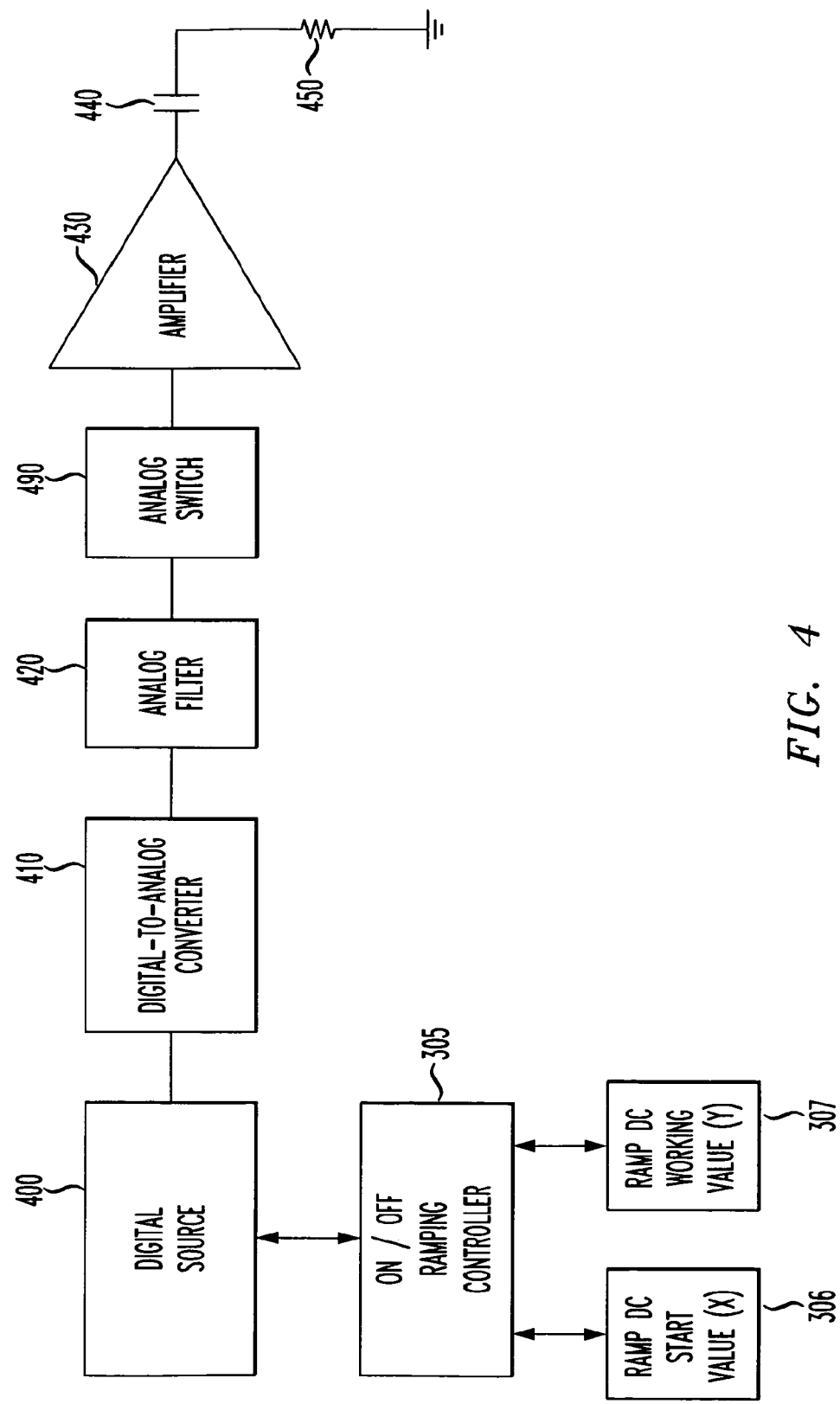
FIG. 4 is a block diagram of an audio output channel for digital audio according to an alternative embodiment of the invention.
Figure 5:
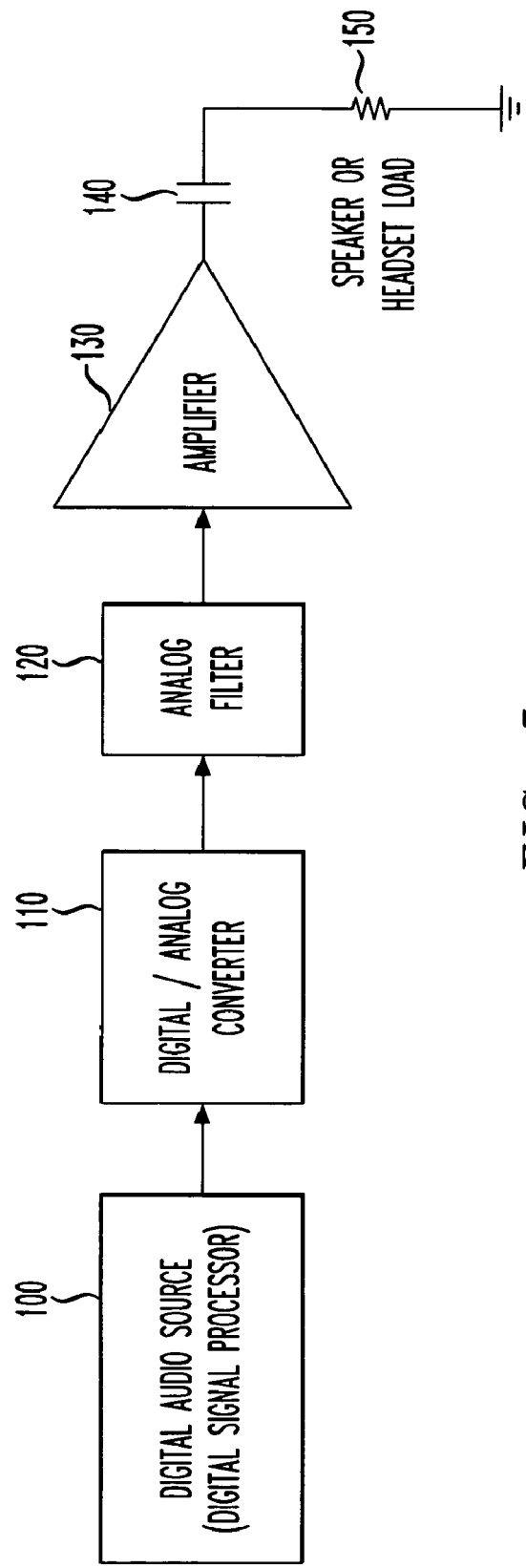
FIG. 5 shows a conventional audio output channel in a digital electronic audio device.
Figure 6:
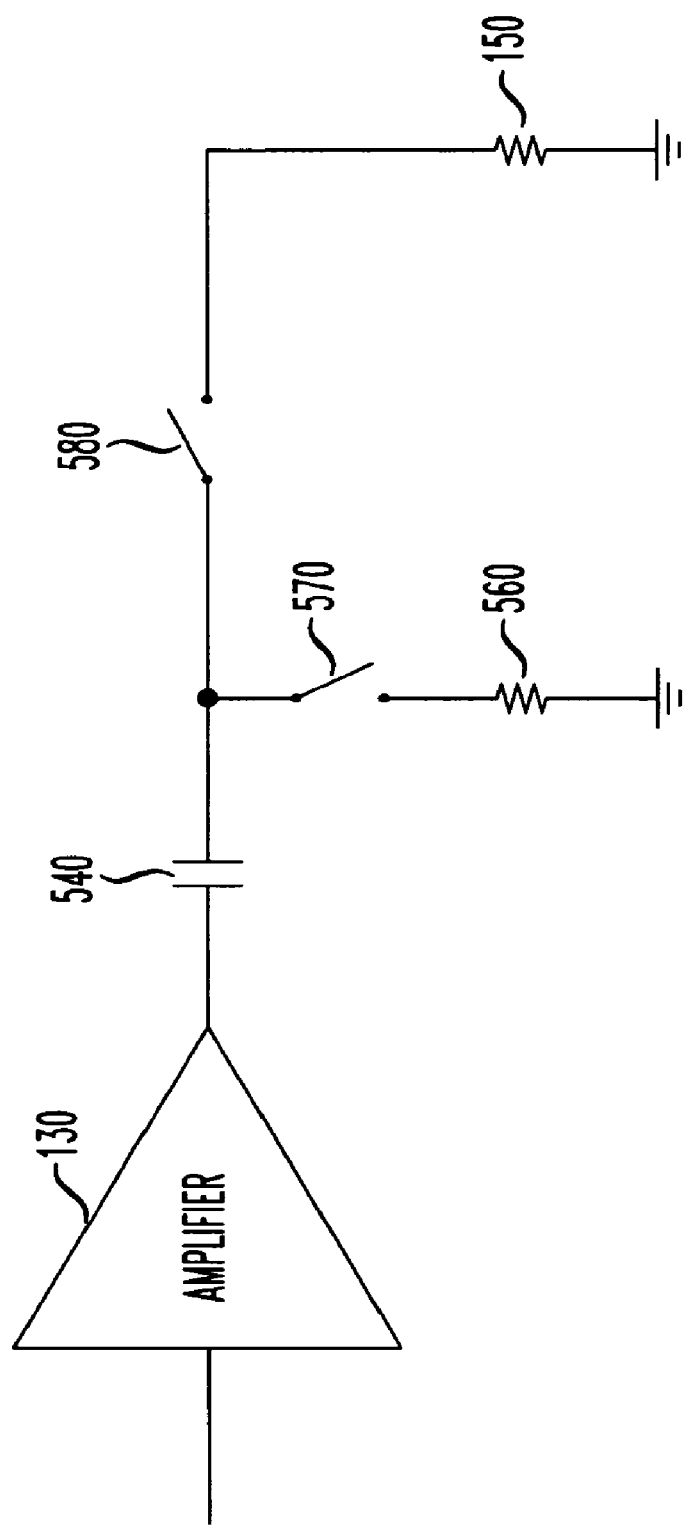
FIG. 6 shows a conventional audio circuit as shown in U.S. Pat. No. 6,157,726.

A digital audio output channel according to an alternative preferred embodiment of the invention is shown in FIG. 4.

In particular, FIG. 4 shows the digital audio output channel driven by a digital audio source 400, a D/A converter 410, an analog filter 420, an analog switch 490, an amplifier stage 430, an AC coupling capacitor 440, and an audio load 450, as shown and described with respect to similar elements in FIG. 1. However, in this particular embodiment, the input to the audio amplifier stage 430 is gated by an analog switch 490 (as opposed to the output switching described in U.S. Pat. No. 6,157,726). The analog switch 490 may be controlled by any appropriate controller, e.g., DSP, or even by the digital source 400 itself.

DC input ramping in a digital audio channel in accordance with the principles of the present invention may be combined with otherwise conventional techniques, e.g., with analog switching as shown in U.S. Pat. No. 6,157,726.

Figure 1B:
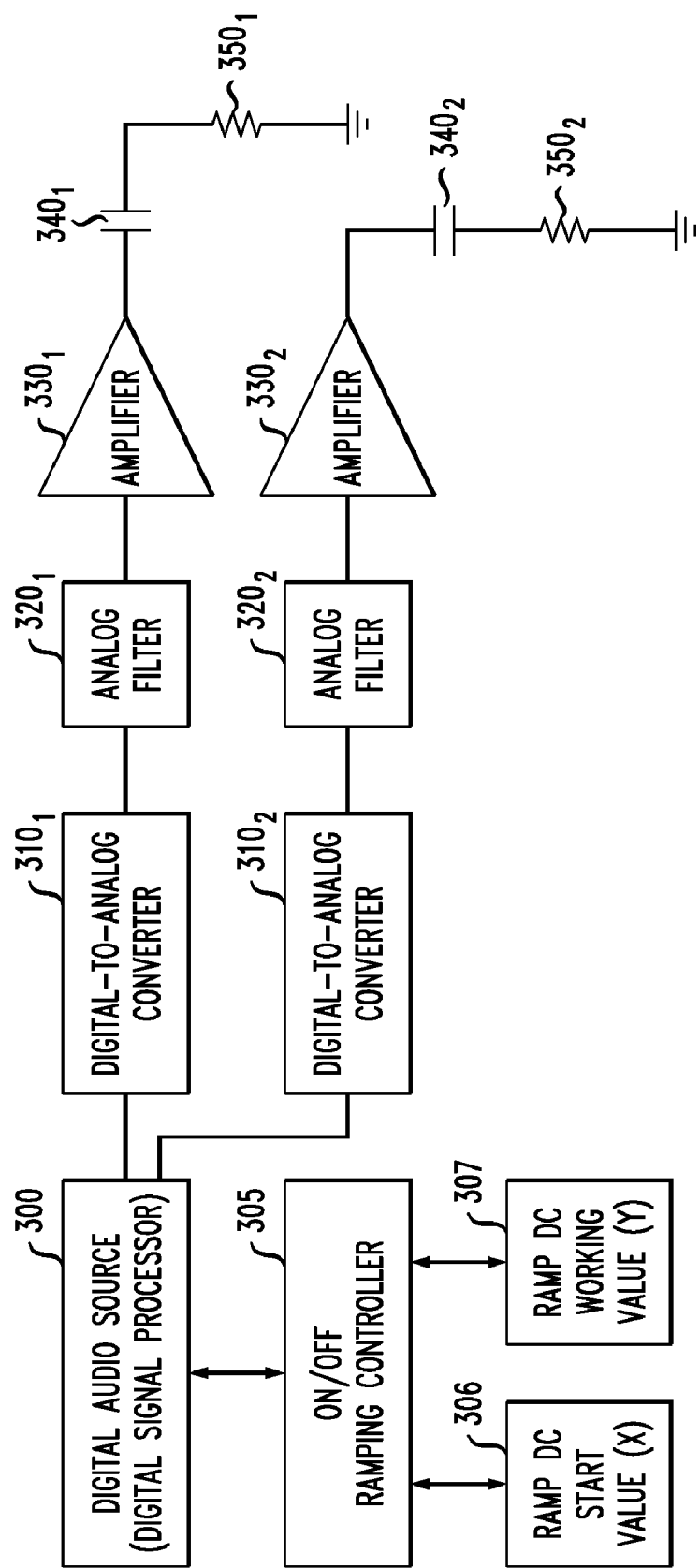
FIG. 1B is a block diagram of an embodiment having a digital audio source and two audio output channels for digital audio connected thereto.
Figure 1C:
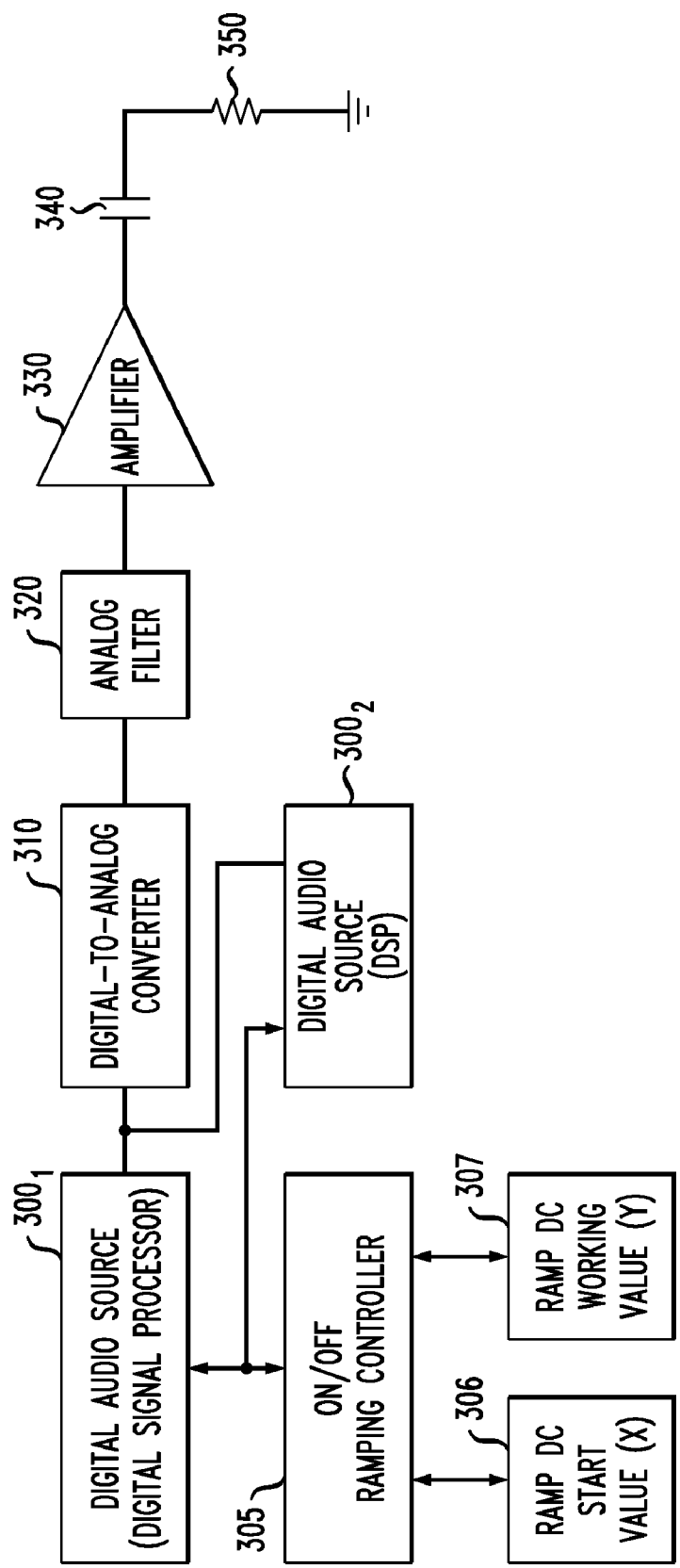
FIG. 1C is a block diagram of an embodiment having two digital audio sources and an audio output channel for digital audio connected thereto.

The above-described embodiments may also be adapted to situations where a digital audio source is switched from one digital audio channel to another, or where the input of a digital audio channel is switched between a plurality of digital audio sources. For example, FIG. 1B shows an embodiment in which a digital audio source (e.g., DSP) 300 can be switched between two digital audio channels, one having a D/A converter $310_1$, an analog filter $320_1$ and an amplifier $330_1$, and the other having a D/A converter $310_2$, an analog filter $320_2$, and an amplifier $330_2$. FIG. 1C shows an embodiment in which the input of a digital audio channel having a D/A converter 310, an analog filter 320, and an amplifier 330 can be switched between digital audio sources $300_1$ and $300_2$. To achieve such a changeover, the digital audio channel in use is first powered down, e.g., according to the method of FIG. 3, then the existing digital audio source may be disconnected from the existing digital audio channel. Next, the appropriate digital audio source and digital audio channel may be connected together, and finally this digital audio channel is powered up, e.g., according to the method of FIG. 2.

It will be appreciated by those skilled in the art that the invention may be applicable to a wide variety of electronic equipment employing digital audio, including not only cellular telephones but also DVD video players, music CD players, computer sound cards, DAT tape recorders and communications receivers employing DSP.

While the invention has been described with reference to the exemplary embodiments thereof, those skilled in the art will be able to make various modifications to the described embodiments of the invention without departing from the true spirit and scope of the invention.

What is claimed is:

1. A method of operating an acoustic device comprising:
a digital signal processor (DSP) for driving a digital audio channel with a digital output signal; and
two digital audio channels, each comprising:
a digital-to-analog converter adapted to convert the digital output signal received from the DSP into a corresponding analog signal; and
an amplifier adapted to convert said analog signal into an amplified signal for driving an audio transducer, the method comprising the steps of:
driving a first of the two audio channels with the digital output signal; configuring the DSP to change the digital output signal so that the amplified signal produced by the amplifier in the first audio channel gradually ramps from a working DC value of said amplifier to a reference DC value;
switching the digital output signal from being applied to said first audio channel to being applied to a second of the two audio channels;
further configuring the DSP to change the digital output signal so that the amplified signal produced by the amplifier in the second audio channel gradually ramps from the reference DC value to a working DC value of said amplifier; and
driving said second audio channel with the digital output signal.

2. The method of claim 1, wherein said reference DC value is a ground potential.

3. The method of claim 1, further comprising the step of:
obtaining a moving average of the amplified signal produced by the amplifier in a digital audio channel to determine a working DC value corresponding to said digital audio channel; and
storing the determined working DC value in a memory, wherein at least one of said steps of configuring the DSP comprises reading from the memory the corresponding working DC value.

4. The method of claim 1, wherein:
at least one of said first and second audio channels comprises an analog switch coupled between the corresponding digital-to-analog converter and the corresponding amplifier; and
the method further comprises the step of, prior to converting the analog signal produced by the corresponding digital-to-analog converter into the corresponding amplified signal, gating said analog signal with said analog switch.

5. The method of claim 1, wherein:
at least one of said first and second audio channels comprises an analog filter coupled between the corresponding digital-to-analog converter and the corresponding amplifier; and
the method further comprises the step of, prior to converting the analog signal produced by the corresponding digital-to-analog converter into the corresponding amplified signal, passing said analog signal through said analog filter.

6. A method of operating an acoustic device comprising:
two digital signal processors (DSPs), each adapted to drive a digital audio channel with a corresponding digital output signal; and
the digital audio channel comprising:
a digital-to-analog converter adapted to convert a digital output signal received from a
DSP into a corresponding analog signal; and
an amplifier adapted to convert said analog signal into an amplified signal for driving an audio transducer, the method comprising the steps of:
driving the audio channel with a first digital output signal produced by a first of said two DSPs;
configuring the first DSP to change the first digital output signal so that the amplified signal produced by the amplifier gradually ramps from a working DC value of said amplifier to a reference DC value;
switching the digital audio channel from being driven by the first digital output signal to being driven by a second digital output signal produced by a second of said two DSPs;
configuring the second DSP to change the second digital output signal so that the amplified signal produced by the amplifier gradually ramps from the reference DC value to the working DC value; and
driving the audio channel with the second digital output signal.

7. The method of claim 6, wherein said reference DC value is a ground potential.

8. The method of claim 6, further comprising the step of:
obtaining a moving average of the amplified signal produced by the amplifier in the digital audio channel to determine the working DC value; and
storing the determined working DC value in a memory, wherein at least one of said steps of (i) configuring the first DSP and (ii) configuring the second DSP comprises reading from the memory the working DC value.

9. The method of claim 6, wherein:
the audio channel comprises an analog switch coupled between the digital-to-analog converter and the amplifier; and
the method further comprises the step of, prior to converting the analog signal produced by the digital-to-analog converter into the amplified signal, gating said analog signal with said analog switch.

10. The method of claim 6, wherein:

the audio channel comprises an analog filter coupled between the digital-to-analog converter and the amplifier; and the method further comprises the step of, prior to converting the analog signal produced by the digital-to-analog converter into the amplified signal, passing said analog signal through said analog filter.

11. An acoustic device, comprising:

a digital signal processor (DSP) for driving a digital audio channel with a digital output signal;

two digital audio channels, each comprising:

a digital-to-analog converter adapted to convert the digital output signal received from the DSP into a corresponding analog signal; and an amplifier adapted to convert said analog signal into an amplified signal for driving an audio transducer; and a controller that:

configures the DSP to:

drive a first of the two audio channels with the digital output signal; and change the digital output signal so that the amplified signal produced by the amplifier in the first audio channel gradually ramps from a working DC value of said amplifier to a reference DC value;

configures the acoustic device to switch the digital output signal from being applied to said first audio channel to being applied to a second of the two audio channels; and further configures the DSP to:

change the digital output signal so that the amplified signal produced by the amplifier in the second audio channel gradually ramps from the reference DC value to a working DC value of said amplifier; and drive said second audio channel with the digital output signal.

12. The device of claim 11, wherein said reference DC value is a ground potential.

13. The device of claim 11, wherein:

the acoustic device is adapted to obtain a moving average of the amplified signal produced by the amplifier in a digital audio channel to determine a working DC value corresponding to said digital audio channel; and the controller is adapted to:

store the determined working DC value in a memory; and read from the memory the corresponding working DC value and configure the DSP using the working DC value read from the memory.

14. The device of claim 11, wherein:

at least one of said first and second audio channels comprises an analog switch coupled between the corresponding digital-to-analog converter and the corresponding amplifier; and prior to converting the analog signal produced by the corresponding digital-to-analog converter into the corresponding amplified signal, said at least one of said first and second audio channels gates said analog signal with said analog switch.

15. The device of claim 11, wherein:

at least one of said first and second audio channels comprises an analog filter coupled between the corresponding digital-to-analog converter and the corresponding amplifier; and prior to converting the analog signal produced by the corresponding digital-to-analog converter into the corresponding amplified signal, said at least one of said first and second audio channels passes said analog signal through said analog filter.

16. An acoustic device, comprising:

two digital signal processors (DSPs), each adapted to drive a digital audio channel with a corresponding digital output signal;

the digital audio channel comprising:

a digital-to-analog converter adapted to convert a digital output signal received from a DSP into a corresponding analog signal; and an amplifier adapted to convert said analog signal into an amplified signal for driving an audio transducer; and a controller that:

configures a first of said two DSPs to:

drive the audio channel with a first digital output signal; and change the first digital output signal so that the amplified signal produced by the amplifier gradually ramps from a working DC value of said amplifier to a reference DC value;

configures the acoustic device to switch the digital audio channel from being driven by the first digital output signal to being driven by a second digital output signal produced by a second of said two DSPs; and configures the second DSP to:

change the second digital output signal so that the amplified signal produced by the amplifier gradually ramps from the reference DC value to the working DC value; and drive the audio channel with the second digital output signal.

17. The device of claim 16, wherein said reference DC value is a ground potential.

18. The device of claim 16, wherein:

the acoustic device is adapted to obtain a moving average of the amplified signal produced by the amplifier in the digital audio channel to determine the working DC value; and the controller is adapted to:

store the determined working DC value in a memory; and read from the memory the working DC value and configure at least one of the first and second DSPs using the working DC value read from the memory.

19. The device of claim 16, wherein:

the audio channel comprises an analog switch coupled between the digital-to-analog converter and the amplifier; and prior to converting the analog signal produced by the digital-to-analog converter into the amplified signal, the audio channel gates said analog signal with said analog switch.

20. The device of claim 16, wherein:

the audio channel comprises an analog filter coupled between the digital-to-analog converter and the amplifier; and prior to converting the analog signal produced by the digital-to-analog converter into the amplified signal, the audio channel passes said analog signal through said analog filter.

* * * * *